United States Patent [19]

Yatsuka

[11] Patent Number: 5,834,979
[45] Date of Patent: Nov. 10, 1998

[54] AUTOMATIC FREQUENCY CONTROL APPARATUS FOR STABILIZATION OF VOLTAGE-CONTROLLED OSCILLATOR

[75] Inventor: Hiroyuki Yatsuka, Tokyo, Japan

[73] Assignee: Fujitsu Limited, Kanagawa, Japan

[21] Appl. No.: 915,226

[22] Filed: Aug. 20, 1997

[30] Foreign Application Priority Data

Nov. 28, 1996 [JP] Japan .................................. 8-317234

[51] Int. Cl.$^6$ ................................ H03L 7/02; H03L 7/06; H03L 27/12; H03L 27/16
[52] U.S. Cl. ................. 331/1 R; 331/178; 332/100; 332/127; 375/303; 455/113
[58] Field of Search ............................ 331/1 R, 4, 178; 327/62, 155; 332/100–102; 375/303–307, 317–319, 360, 364, 371; 455/113

[56] References Cited

U.S. PATENT DOCUMENTS 3,867,706  2/1975  Gili .......................................... 331/1 R
4,429,406  1/1984  Hale ......................................... 375/113
4,644,296  2/1987  Crossley et al. ........................ 331/1 R

FOREIGN PATENT DOCUMENTS 7-170302   7/1995   Japan .

*Primary Examiner*—David Mis
*Attorney, Agent, or Firm*—Helfgott & Karas, PC

[57] ABSTRACT

The output of a voltage-controlled oscillator (VCO), after being passed through a resonator having a single-peak characteristic, is detected by a detector. The output of the detector is sampled and held at a time instant that the control input voltage to the VCO reaches a maximum and also at a time instant that it reaches a minimum, and the difference between them is fed back to the control input of the VCO. In this way, the center frequency of the VCO is controlled so that it becomes equal to the center frequency of the resonator. In the case of a VCO as an FM modulator in an FM-CW radar, the sample-and-hold timing is derived from a clock signal based on which a triangle wave is generated. In the case of a VCO as an FSK modulator, the sample-and-hold timing is obtained by detecting a 0 and a 1 in input data.

6 Claims, 14 Drawing Sheets

AUTOMATIC FREQUENCY CONTROL APPARATUS FOR STABILIZATION OF VOLTAGE-CONTROLLED OSCILLATOR

BACKGROUND OF THE INVENTION

1. Field of the Invention

The present invention relates to an automatic frequency control apparatus for stabilizing the oscillation frequency of a voltage-controlled oscillator (VCO), specifically an automatic frequency control apparatus for stabilizing the oscillation frequency of a VCO as an FM modulator having a wide-band modulation characteristic such as used in an FSK (Frequency Shift Keying) modulator or in an FM-CW (Frequency Modulation-Continuous Wave) radar, and more specifically to an automatic frequency control apparatus for stabilizing the oscillation frequency of a VCO as an FM modulator having a wide-band modulation characteristic in the super to extremely high frequency bands of the microwave/millimeter-wave regions.

2. Description of the Related Art

A VCO with a wide frequency-variable range, generally used as a microwave FM modulator having a wide-band modulation characteristic, tends to exhibit a greater variation in center frequency due to variations in temperature, supply voltage, etc. than a VCO with a narrow variable range. Traditionally, two methods have been known to provide stabilization of the oscillation frequency of such a wide frequency-variable range VCO.

In the first method, a portion of the VCO output is separated by a directional coupler, and the separated portion is split by a hybrid between two paths. In one of the two branch paths, a resonator is provided that has a center frequency $f_{r1}$ slightly lower than the target center frequency $f_0$ of the VCO, while in the other branch path is provided a resonator having a center frequency $f_{r2}$ slightly higher than the target center frequency $f_0$. The outputs of the two resonators are respectively detected by two detectors, and the detected voltage from either one of the detectors is inverted in polarity and added to the other to obtain voltage $V_{out}$. The voltage $V_{out}$ has a characteristic such that the voltage is zero when the output frequency f of the VCO is equal to $f_0$, the voltage increasing as the output frequency f decreases below $f_0$ and decreasing as it increases above $f_0$. By adding this voltage $V_{out}$ to the VCO input for feedback, the center frequency of the VCO stabilizes at $f_0$.

In the second method, a portion of the VCO output is separated by a directional coupler, and the separated portion is split by an in-phase hybrid between two paths in phase. A resonator whose center frequency $f_0$ is the same as the target center frequency $f_0$ of the VCO is provided in only one of the two branch paths. The signal passed through the branch path where the resonator is provided and the signal passed through the branch path where no resonator is provided are respectively applied to two inputs of a 90° hybrid. At this time, the line lengths of the branch paths are adjusted so that the two signals applied to the 90° hybrid are in phase at frequency $f_0$. The two signals output from the 90° hybrid are respectively detected by two detectors, and the output from either one of the detectors is inverted in polarity and added to the output of the other to obtain voltage $V_{out}$. The voltage $V_{out}$ has the same characteristic as previously described; therefore, by adding this $V_{out}$ to the VCO input for feedback, the center frequency of the VCO stabilizes at $f_0$.

In the millimeter-wave region, the wavelength is extremely short, and high-precision processing is required for the fabrication of high-frequency circuits. Also, the fabrication of semiconductor devices for detecting millimeter waves requires advanced semiconductor manufacturing technology for miniaturization as well as materials for enhanced performance, compared with semiconductor devices operating at lower frequencies. As a result, circuit components used in the millimeter wave region are very expensive compared with components in lower frequency regions. Furthermore, in some millimeter-wave applications, a portion of high-frequency circuitry is constructed from a three-dimensional waveguide circuit, and this portion hampers circuit miniaturization. Therefore, in the automatic frequency control of a VCO applicable in the millimeter wave region, it is advantageous from the viewpoint of size and cost reductions to reduce the proportion of high-frequency circuits as much as possible. In the earlier described first prior art method, a directional coupler, a hybrid, two resonators, and two detectors are used as the high-frequency circuits, and in the second prior art method, a directional coupler, an in-phase hybrid, a resonator, a 90° hybrid, and two detectors are used as the high-frequency circuits. Both methods therefore involve problems in terms of size and cost reductions. Moreover, the first method requires adjusting the resonance characteristics of the two resonators in order to obtain good control characteristics, while the second method requires that the two signals input to the two detectors be maintained in phase at the center frequency by adjusting the line length. This adds to the number of processing steps.

SUMMARY OF THE INVENTION

An object of the present invention is to provide an automatic frequency control apparatus which is applicable to a VCO operating in the millimeter-wave region and having a wide frequency-variable range, and in which the proportion of high-frequency circuits is reduced and the adjustment is made easy, compared with the prior art construction.

According to the present invention, there is provided an automatic frequency control apparatus, for stabilizing the oscillation frequency of a voltage-controlled oscillator, comprising: a timing signal generating circuit for generating a first timing signal to indicate that a control voltage input to the voltage-controlled oscillator is at a first value, and a second timing signal to indicate that the control voltage input is at a second value; a resonator which has a single-peak characteristic, and to which a portion of an output of the voltage-controlled oscillator is input; a detector for detecting an output of the resonator; a first sample-and-hold circuit for sampling and holding an output of the detector in accordance with the first timing signal; a second sample-and-hold circuit for sampling and holding an output of the detector in accordance with the second timing signal; an operational amplifier for accepting outputs of the first and second sample-and-hold circuits, and for outputting a feedback voltage based on the outputs; and an adder for adding the feedback voltage to the control voltage input to the voltage-controlled oscillator.

DESCRIPTION OF THE PREFERRED EMBODIMENTS

Before describing the preferred embodiments of the present invention, the previously given prior art will be described with reference to drawings.

Figure 1:
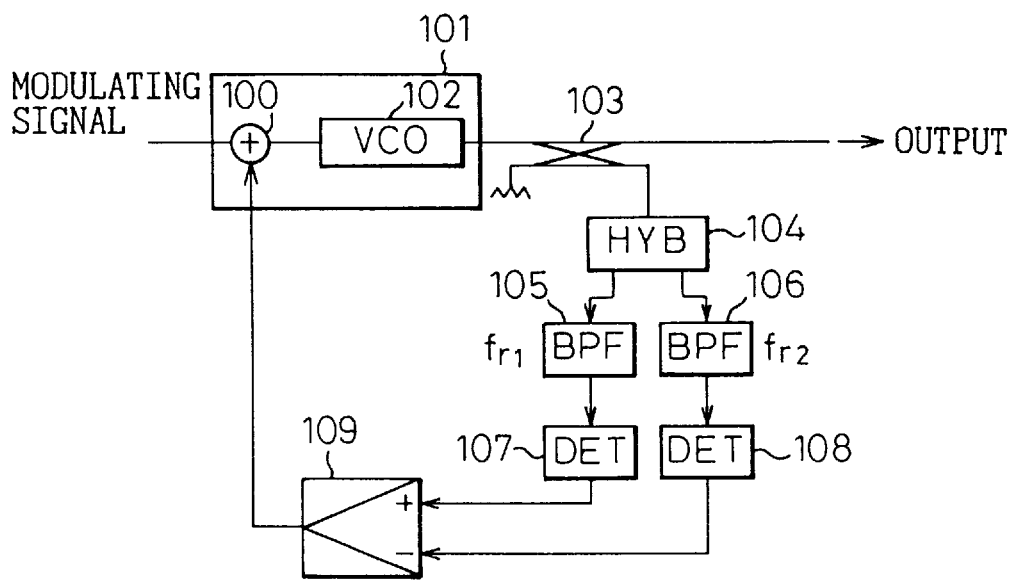
FIG. 1 is a block diagram showing a first example of a circuit used for frequency stabilization of a VCO according to the prior art.

In the first prior art, as shown in FIG. 1, a portion of the output of a VCO 102 constituting an FM modulator 101 is separated by a directional coupler 103, and the separated portion is split by a hybrid 104 between two paths. In one of the two branch paths, a resonator (or a band-pass filter) 105 is provided that has a center frequency $f_{r1}$ slightly lower than the target center frequency $f_0$ of the VCO 102, while in the other path is provided a resonator (or a band-pass filter) 106 having a center frequency $f_{r2}$ slightly higher than the target center frequency $f_0$. The outputs of the resonators 105 and 106 are detected by detectors 107 and 108, respectively. The outputs of the detectors 107 and 108 are applied to a noninverting input and an inverting input of a differential amplifier 109, respectively, and the output of the differential amplifier 109 is fed back to the input of the VCO 102 via an adder 100.

Figure 2:
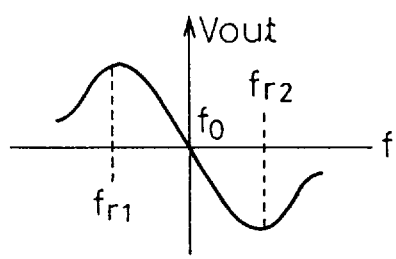
FIG. 2 is a diagram for explaining the operation of the circuit of FIG. 1.

The resonators 105 and 106 have single-peak characteristics with peaks occurring at the respective center frequencies $f_{r1}$ and $f_{r2}$ ($f_{r1}<f_0<f_{r2}$), so that the output $V_{out}$ of the differential amplifier 109 exhibits the characteristic of decreasing monotonically as the output frequency f of the VCO increases between $f_{r1}$ and $f_{r2}$, the output $V_{out}$ being equal to zero when the output frequency f is equal to $f_0$, as shown in FIG. 2. Therefore, by feeding this back to the input of the VCO 102, the center frequency of the VCO 102 stabilizes at $f_0$.

Figure 3:
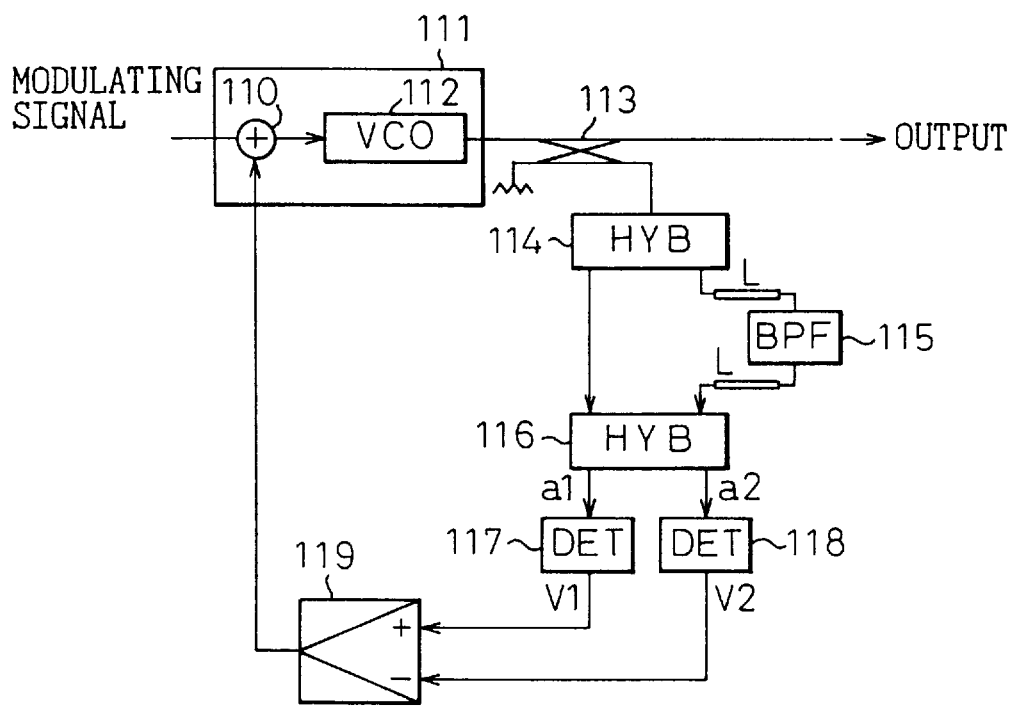
FIG. 3 is a block diagram showing a second example of a circuit used for frequency stabilization of a VCO according to the prior art.

In the second prior art of FIG. 3, a portion of the output of a VCO 112 constituting an FM modulator 111 is separated by a directional coupler 113, and the separated portion is split by an in-phase hybrid between two paths in phase. A resonator (or a band-pass filter) 115 whose center frequency $f_r$ is the same as the target center frequency $f_0$ of the VCO 112 is provided in only one of the two branch paths. The signal passed through the branch path where the resonator is provided and the signal passed through the branch path where no resonator is provided are respectively applied to two input ports of a 90° hybrid 116. Outputs a1 and a2 from two output ports of the 90° hybrid 116 are detected by detectors 117 and 118, respectively. The outputs of the detectors 117 and 118 are applied to a noninverting input and an inverting input of a differential amplifier 119, respectively, and the output of the differential amplifier 119 is fed back to the input of the VCO 112 via an adder 110.

Figure 4:
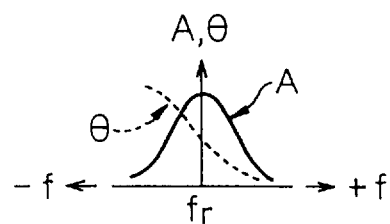
FIGS. 4 to 8 are diagrams for explaining the operation of the circuit of FIG. 3.
Figure 5:
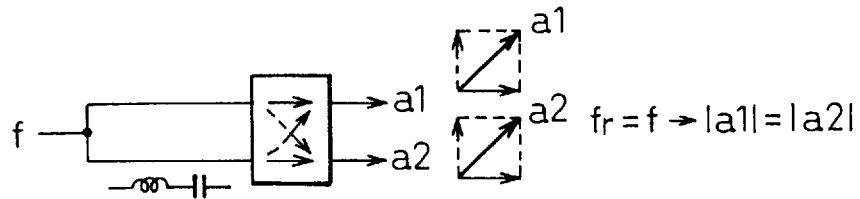
Figure 6:
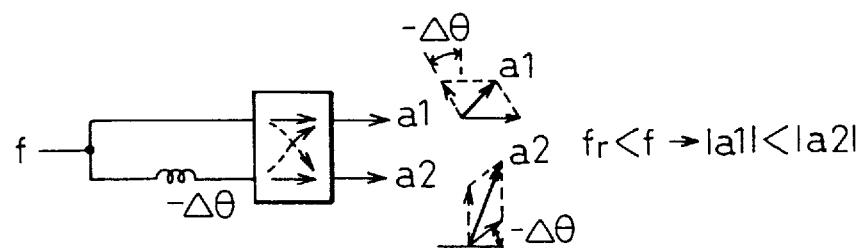
Figure 7:
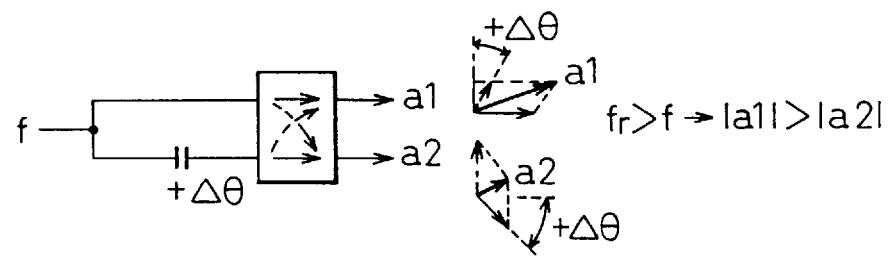
Figure 8:
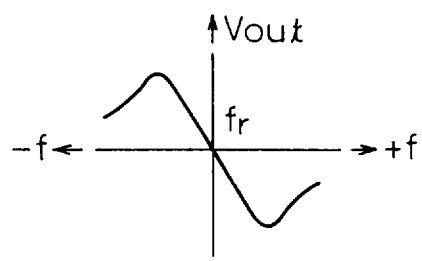

FIG. 4 shows the amplitude (A) and phase (θ) characteristics of the resonator 115. As shown in FIG. 4, the resonator 115 has a single-peak amplitude characteristic with the peak occurring at frequency $f_r$, and has a phase characteristic such that the phase is delayed as the frequency f increases in the vicinity of $f_r$. When line length L is adjusted so that the two signals applied to the inputs of the 90° hybrid 116 are in phase at the frequency $f_r$, then when the output frequency f of the VCO is equal to $f_r$, the outputs a1 and a2 of the 90° hybrid 116 are equal in amplitude, as shown in the equivalent circuit of FIG. 5, so that the output $V_{out}$ of the differential amplifier 119 is zero. When $f_r<f$, the resonator 115 becomes inductive and delays the phase by Δθ, as shown in the equivalent circuit of FIG. 6; accordingly, |a1|<|a2|, so that the output $V_{out}$ of the differential amplifier 119 decreases as the frequency increases. When $f_r>f$, the resonator 115 becomes capacitive and advances the phase by Δθ, as shown in the equivalent circuit of FIG. 7; accordingly, |a1|>|a2|, so that the output $V_{out}$ of the differential amplifier 119 increases as the frequency decreases. Thus $V_{out}$ exhibits the characteristic of decreasing as the output frequency f of the VCO increases in the vicinity of $f_r$, as shown in FIG. 8; therefore, by feeding this back to the input of the VCO, the center frequency of the VCO stabilizes at $f_0$.

The prior art examples shown in FIGS. 1 and 3 require many high-frequency components; this not only increases the cost but hampers the reduction of the apparatus size. Furthermore, the first prior art requires adjusting the resonance characteristics of the two resonators in order to obtain good control characteristics, while the second prior art requires adjusting the line length.

The preferred embodiments of the present invention will now be described with reference to the accompanying drawings.

Figure 9:
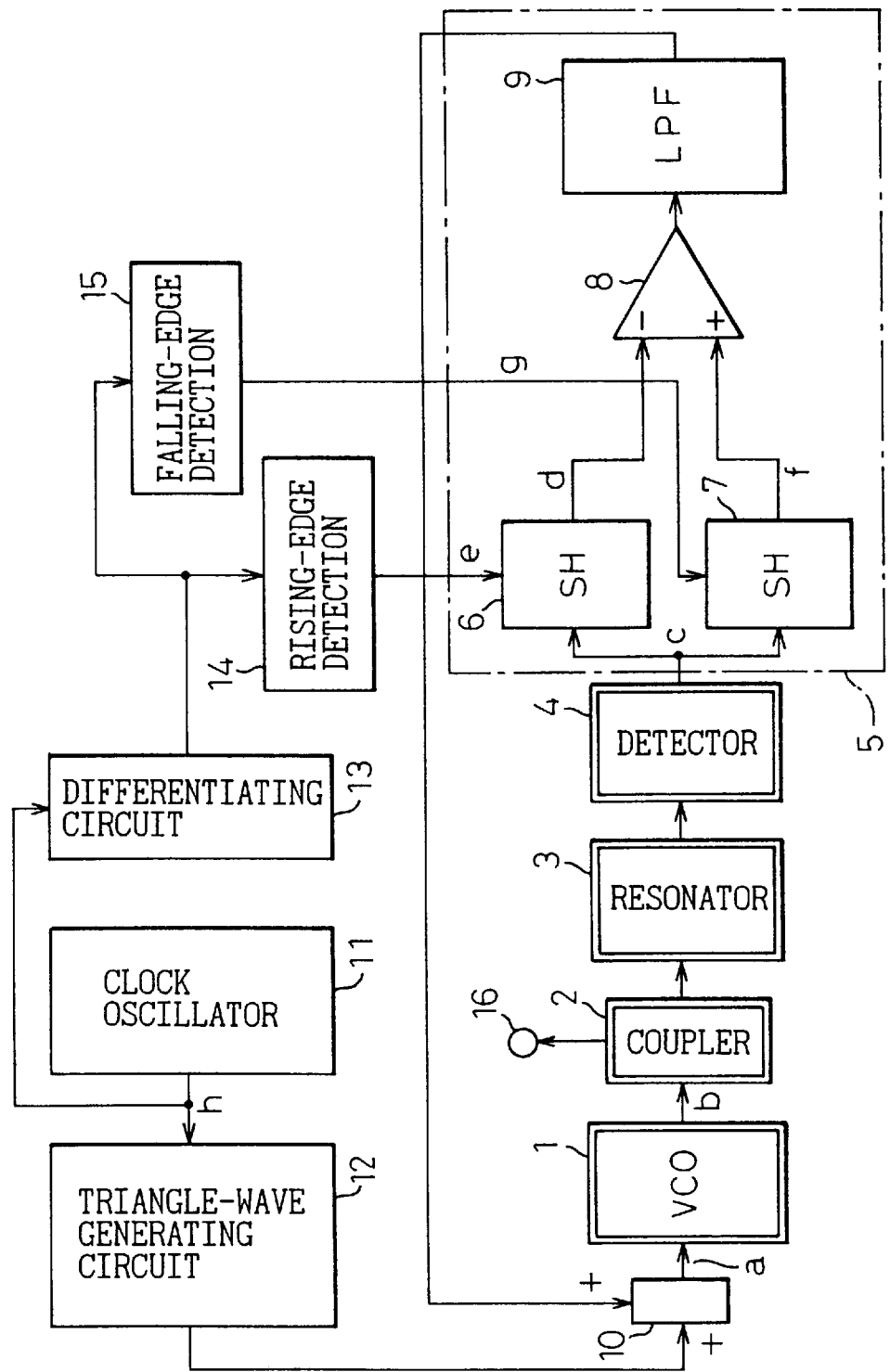
FIG. 9 is an automatic frequency control apparatus according to a first embodiment of the present invention.

FIG. 9 shows an example in which the present invention is applied to an apparatus for stabilizing the oscillation frequency of a voltage-controlled oscillator used as a frequency modulator in an FM-CW radar. In FIG. 9, reference numeral 1 is the voltage-controlled oscillator (VCO), 2 is a coupler, 3 is a resonator, 4 is a detector, 5 is a control circuit, 6 and 7 are first and second sample-and-hold (SH) circuits, 8 is a differential amplifier, 9 is a loop filter (LPF), 10 is an adder, 11 is a clock oscillator for generating a rectangular-wave clock signal, 12 is a triangle-wave generating circuit, 13 is a differentiating circuit, 14 is a rising-edge detection circuit, 15 is a falling-edge detection circuit, and 16 is an output terminal.

The FM-CW radar transmits a ultra-high frequency signal frequency-modulated by a triangle-wave signal, and receives the reflected wave from a target object, thereby obtaining the distance to the target and the Doppler frequency and thus measuring the relative velocity with respect to the target. The voltage-controlled oscillator 1 outputs the ultra-high frequency signal frequency-modulated by the triangle-wave signal.

The voltage-controlled oscillator 1 has a center frequency $f_0$ of several GHz to several tens of GHz. The elements shown inside the double-lined blocks, i.e., the voltage-controlled oscillator 1, the coupler 2, the resonator 3, and the detector 4, are the ultra-high frequency circuit components. The control circuit 5 is constructed with low-frequency circuit components, including the first and second sample-and-hold circuits 6 and 7, the differential amplifier 8, and the loop filter 9.

The voltage-controlled oscillator 1 outputs a frequency-modulated signal b in accordance with an input modulating signal a; the frequency-modulated signal b is applied to a transmitter or the like (not shown) via the output terminal 16, while a portion thereof is separated by the coupler 2, which is a directional coupler or the like, and input to the resonator 3. The resonator 3 has a band-pass single-peak characteristics for example, and is initially set so that the center frequency (resonant frequency) $f_r$ of its pass band coincides with the center frequency $f_0$ of the voltage-controlled oscillator 1. An output signal from the resonator 3 is input to the detector 4 which detects the frequency-modulated signal and supplies the detected output signal c to the control circuit 5.

The clock oscillator 11 outputs a clock signal h of a frequency of several hundred Hz to several kHz, for example, sufficiently lower than the center frequency $f_0$ of the voltage-controlled oscillator 1. The triangle-wave generating circuit 12 generates a triangle-wave signal synchronized to the clock signal h, and supplies it as the input modulating signal a to the voltage-controlled oscillator 1 via the adder 10.

The clock signal h from the clock oscillator 1 is differentiated by the differentiating circuit 13, and the rising and falling edges of the clock signal h are detected by the rising-edge detection circuit 14 and the falling-edge detection circuit 15, respectively. Sampling pulses e and g at the respective detection timings are applied to the first and second sample-and-hold circuits 6 and 7 which then sample and hold the detected output signal c from the detector 4. The sample-and-hold output signals d and f are input to the differential amplifier 8 to obtain the difference. The difference as an error signal is passed through the loop filter 9 and input to the adder 10 where the error signal is added to the input modulating signal a before being supplied to the voltage-controlled oscillator 1.

The maximum frequency deviation of the modulated output signal b of the voltage-controlled oscillator 1 occurs when the triangle-wave signal reaches a positive or negative maximum value. Suppose, for example, that the triangle-wave signal reaches a positive maximum value at the rising edge of the clock signal h and a negative maximum value at the falling edge of it. Then, in the first sample-and-hold circuit 6, the detected output signal c from the detector 4 at the time of the positive maximum frequency deviation is sampled and held, while in the second sample-and-hold circuit 6, the detected output signal c from the detector 4 at the time of the negative maximum frequency deviation is sampled and held.

Therefore, by coupling the first and second sample-and-hold circuits 6 and 7 to the inverting and noninverting inputs of the differential amplifier 8, respectively, and by feeding the output thereof back to the input of the voltage-controlled oscillator 1 through the loop filter 9 and the adder 10, the voltage-controlled oscillator 1 is controlled so that the center frequency of its output coincides with $f_0$.

Figure 10:
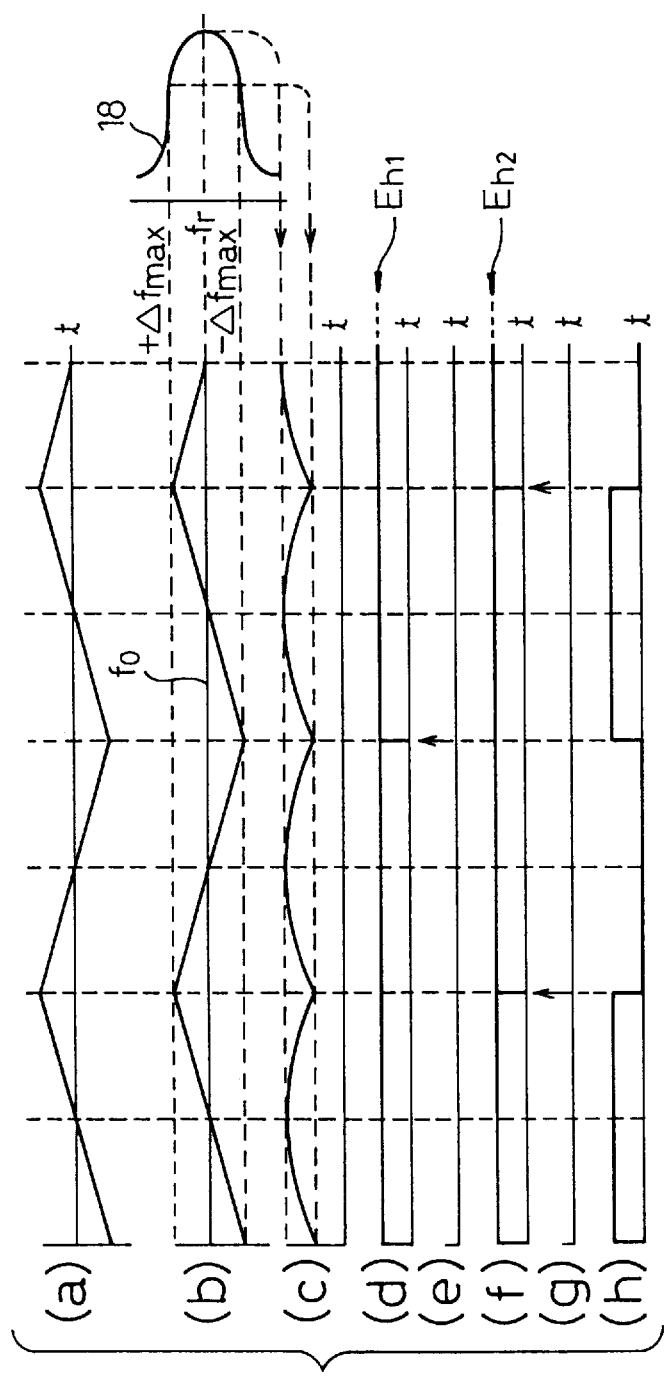
FIGS. 10 and 11 are waveform diagrams for explaining the operation of the apparatus of FIG. 9.

FIG. 10 is a waveform diagram for explaining the operation of the apparatus of FIG. 9. The waveforms of the respective signals a to h are shown in (a) to (h), with time t plotted along the abscissa. Here, reference numeral 18 shows the band-pass single-peak characteristic of the resonator 3, with $f_r$ designating its resonant frequency (center frequency) and $f_0$ the center frequency of the voltage-controlled oscillator 1. The modulating signal a, which is input from the triangle-wave generating circuit 12 to the voltage-controlled oscillator 1 via the adder 10, is a triangle wave as shown in (a), so that the positive and negative frequency derivations of the frequency-modulated signal b about the center frequency $f_0$ are $+\Delta f_{max}$ and $-\Delta f_{max}$, respectively.

At this time, if the center frequency $f_0$ of the voltage-controlled oscillator 1 is equal to the center frequency $f_r$ of the resonator 3, the output signal of the resonator 3 is maximum when the frequency deviation is zero, the output signal decreasing with increasing frequency deviation in the positive or negative direction. Therefore, the detected output signal c of the detector 3 is as shown in (c).

Also suppose that the clock signal h from the clock oscillator 11 is the rectangular wave shown in (h). Then, the differentiating circuit 13 differentiates it, and the rising-edge detection circuit 14 detects the rising edge of the clock signal h and outputs the sampling pulse e shown in (e), while the falling-edge detection circuit 15 detects the falling edge of the clock signal h and outputs the sampling pulse g shown in (g).

The first sample-and-hold circuit 6, in synchronizm with the sampling pulse e, samples and holds the detected output signal c at the time of the negative maximum frequency deviation $-\Delta f_{max}$, while the second sample-and-hold circuit 7, in synchronizm with the sampling pulse g, samples and holds the detected output signal c at the time of the positive maximum frequency deviation $+\Delta f_{max}$. The sample-and-hold output signals d and f, therefore, are as shown by $E_{h1}$ and $E_{h2}$ in (d) and (f), respectively. In this case, if $f_0=f_r$, then $E_{h1}=E_{h2}$, so that the output signal $E_e$ of the differential amplifier 8 is $E_e=E_{h1}-Eh_2=0$. The error signal, when $f_0=f_r$, is therefore zero.

Figure 11:
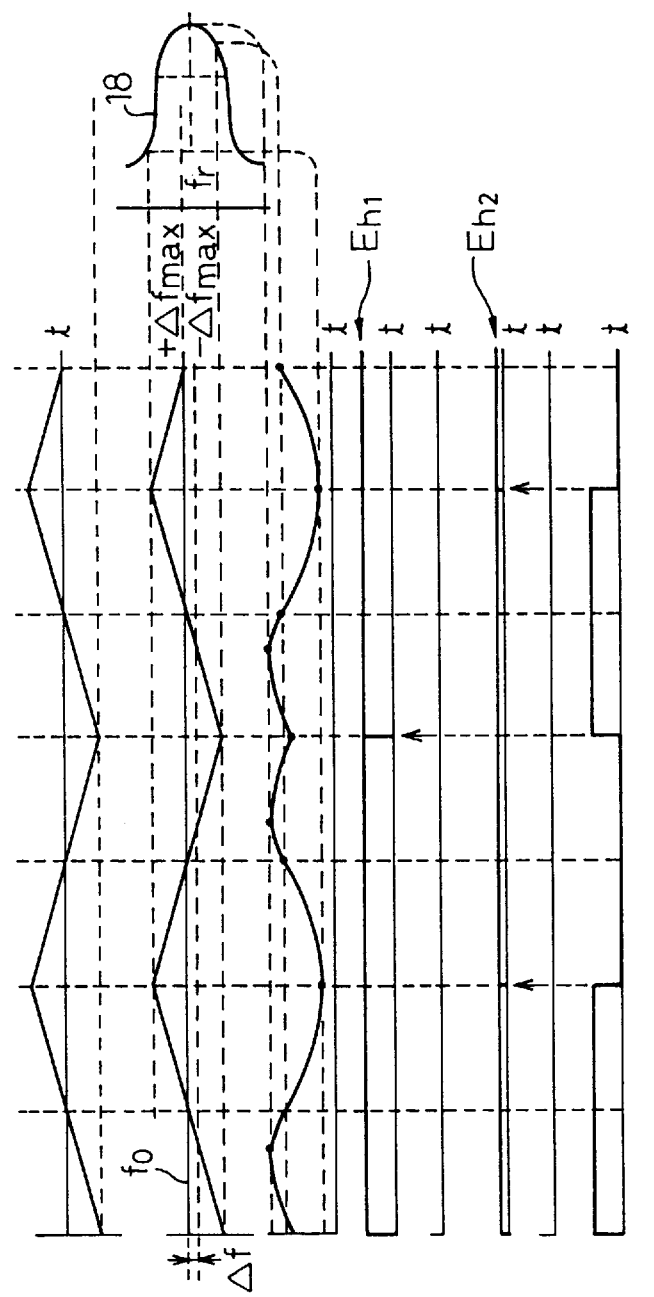

FIG. 11 is a diagram for explaining a center frequency noncoincidence state in the first embodiment of the present invention. The illustrated example shows the case where the center frequency $f_0$ of the voltage-controlled oscillator 1 is deviated by $\Delta f$ from the resonant frequency (center frequency) $f_r$ of the resonator 3, and (a) to (h) show waveform examples of the same signals as shown in FIG. 10. The voltage-controlled oscillator 1 outputs the frequency-modulated signal b in accordance with the input modulating signal a which is the triangle-wave signal shown in (a); if, at this time, the center frequency $f_0$ is deviated by $\Delta f$ from the resonant frequency (center frequency) $f_r$ of the resonator 3, as shown in (b), the output signal of the resonator 3 varies as shown in (c), as a result of which the value of the output signal c of the detector 4 differs between the time of the positive maximum frequency deviation $+\Delta f_{max}$ and the time of the negative maximum frequency deviation $-\Delta f_{max}$.

Accordingly, when the detected output signal c is sampled and held by using the sampling pulses e and g shown in (e) and (g), then $E_{h1}>E_{h2}$ as shown in (d) and (h). In this case, the output signal $E_e$ of the differential amplifier 8 represents the difference between the sample-and-hold output signals d and f ($E_e=E_{h2}-E_{h1}$), and is returned as an error signal through the loop filter 9 and the adder 10 to the voltage-controlled oscillator 1 for negative feedback, thus performing control to bring the center frequency $f_0$ of the voltage-controlled oscillator 1 close to the resonant frequency (center frequency) $f_r$ of the resonator 3. That is, when the center frequency $f_0$ of the voltage-controlled oscillator 1 changes due to ambient temperature, etc., control is automatically performed so that the center frequency $f_0$ coincides with the center frequency $f_r$ of the resonator 3, i.e., $E_{h1}=E_{h2}$. In this way, stabilization of the voltage-controlled oscillator 1 can be achieved.

In the above embodiment, the triangle-wave signal synchronized to the clock signal having a predefined period is used as the input modulating signal; alternatively, a continuous wave signal such as a sine-wave signal may be used as the input modulating signal, in which case the detected output signals at the time of the positive and negative maximum frequency deviations corresponding to the positive and negative maximum amplitude values of the input modulating signal are sampled and held, the difference between the sample-and-hold output signals is obtained, and the difference as an error signal is supplied to the voltage-controlled oscillator 1 for negative feedback.

The resonator 3 may be constructed using, for example, a dielectric resonator having excellent temperature characteristics. Further, the resonator 3 may be configured to have a band-elimination single-peak characteristic instead of the band-pass single-peak characteristic. In that case, the band elimination characteristic is set so that the detected output signal reaches a minimum when the resonant frequency (center frequency) $f_r$ of the resonator is equal to the center frequency of the voltage-controlled oscillator 1, and reaches a maximum at the time of the maximum frequency deviation.

When the band pass characteristic 18 shown in FIGS. 10 and 11 is replaced by the band elimination characteristic, therefore, the relationship of (c) with respect to (b) becomes opposite to that shown, so that the sample-and-hold output signal level can be made larger than in the above-described embodiment. Furthermore, since the resonator 3 has a band-pass or band-elimination single-peak characteristic, it is easy to adjust the resonant frequency $f_r$ to the predefined center frequency $f_0$.

Figure 12:
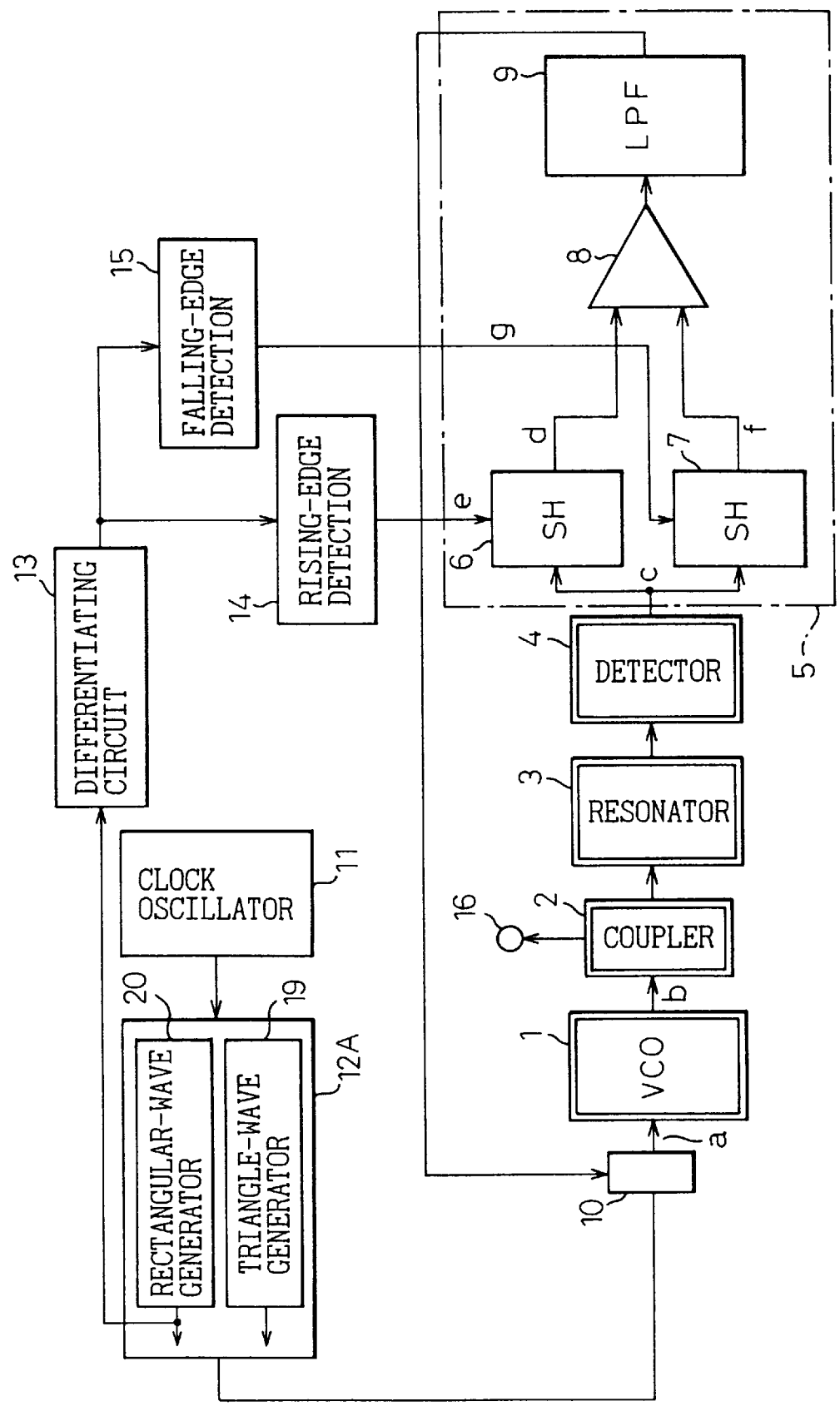
FIG. 12 is an automatic frequency control apparatus according to a second embodiment of the present invention.

FIG. 12 is a diagram showing a second embodiment of the present invention, in which the same reference numerals as those in FIG. 9 designate the same components. Reference numeral 12A is a triangle-wave generating circuit, 19 is a triangle-wave generator, and 20 is a rectangular-wave generator. The triangle-wave generating circuit 12A includes the triangle-wave generator 19 and rectangular wave generator 20; the triangle-wave generator 19 generates a continuous triangle-wave signal in synchronism with the clock signal from the clock oscillator 11, while the rectangular-wave generator 20 generates and inserts a rectangular-wave signal for every predetermined multiple cycles of the triangle-wave signal.

Thus the input modulating signal a to the voltage-controlled oscillator 1 consists of the continuous triangle-wave signal with the rectangular-wave signal inserted therein for every predetermined multiple cycles thereof, and the resulting frequency-modulated signal b exhibits a frequency deviation corresponding to the waveform of the input modulating signal a. A portion of the frequency-modulated signal b is separated by the coupler 2, which is a directional coupler or the like, and input to the resonator 3 which then outputs a signal of a level corresponding to its band-pass single-peak characteristic. This output signal is input to the detector 4.

The detected output signal c from the detector 4 is input to the first and second sample-and-hold circuits 6 and 7 where the signal is sampled and held by the sampling pulses e and g from the rising-edge detection circuit 14 and falling-edge detection circuit 15. The sample-and-hold output signals d and f are input to the differential amplifier 8, and the difference as an error signal is supplied to the voltage-controlled oscillator 1 through the loop filter 9 and adder 10.

Here, the rectangular-wave signal from the rectangular-wave generator 20 is differentiated by the differentiating circuit 13, and the rising-edge detection circuit 14 detects the rising edge of the rectangular-wave signal and outputs the sampling pulse e, while the falling-edge detection circuit 15 detects the falling edge of the rectangular-wave signal and outputs the sampling pulse g. That is, a comparison is made between the sample-and-hold output signals corresponding to the detected output signals at the time of the positive and negative maximum frequency deviations of the frequency-modulated signal occurring in accordance with the rectangular-wave signal, and the difference as an error signal is fed back for negative feedback so that the center frequency of the voltage-controlled oscillator 1 is made to coincide with the resonant frequency (center frequency) of the resonator 3.

Figure 13:
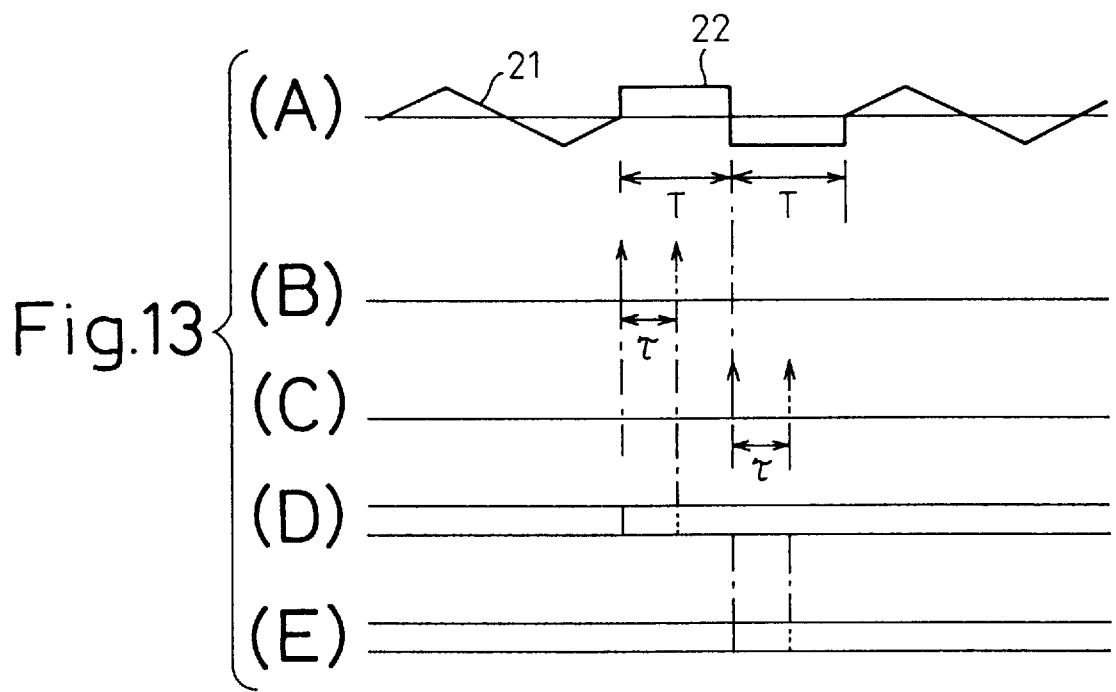
FIG. 13 is a waveform diagram for explaining the operation of the apparatus of FIG. 12.

FIG. 13 is a diagram for explaining the operation of the second embodiment of the present invention. (A) shows an example of the input modulating signal, in which the rectangular-wave signal 22 is inserted for every predetermined multiple cycles of the triangle-wave signal 21. In (B), the sampling pulse e generated by detecting the rising edge of the rectangular-wave signal 22 is shown by a solid arrow, and in (C), the sampling pulse g generated by detecting the falling edge of the rectangular-wave signal 22 is shown by a solid arrow. (D) and (E) show the respective sample-and-hold output signals.

Since the frequency-modulated signal in accordance with the rectangular-wave signal 22 has a continuous positive or negative maximum frequency deviation period T, provisions may be made so that sampling pulses indicated by dotted arrows are applied to the sample-and-hold circuits 6 and 7 after a delay time τ which is equivalent to delaying the sampling pulses indicated by the solid arrows by about T/2. This can be accomplished either by delaying the clock signal by τ, or by delaying the differentiated output signal from the differentiating circuit 13 by τ, or by delaying each sampling pulse by τ.

The above embodiment has shown the case where the rectangular-wave signal 22 is inserted for every predetermined multiple cycles of the continuous triangle-wave signal 21, but it is also possible to insert a rectangular-wave signal for giving the timing to measure the deviation of the center frequency $f_0$ of the voltage-controlled oscillator 1, for every predetermined multiple cycles of an arbitrary continuous signal having a predefined periodicity such as a continuous sine wave signal.

Figure 14:
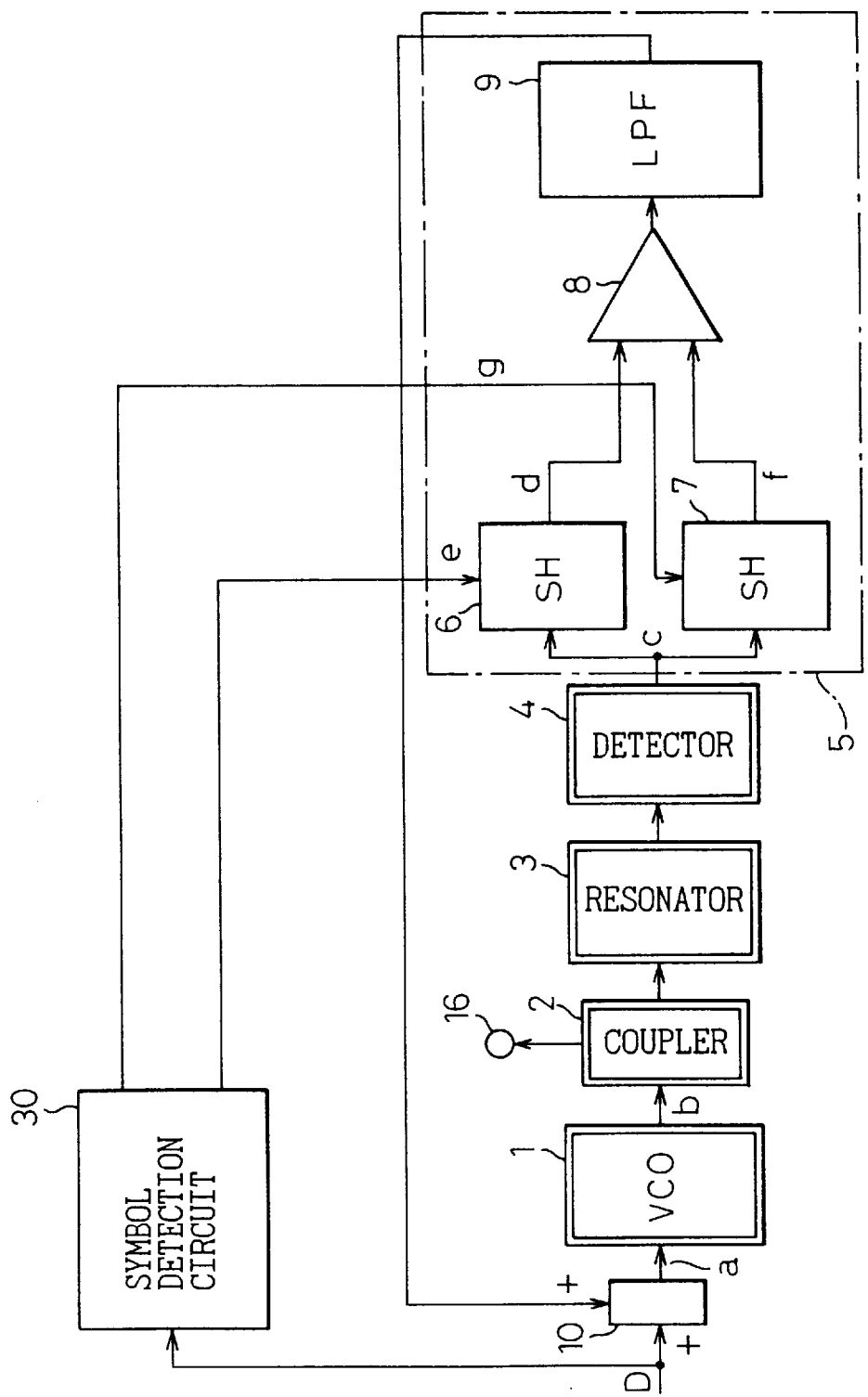
FIG. 14 is an automatic frequency control apparatus according to a third embodiment of the present invention.

FIG. 14 is a diagram for explaining a third embodiment of the present invention, showing an example in which the present invention is applied to an apparatus for stabilizing the oscillation frequency of a voltage-controlled oscillator used as an FSK modulator. The same reference numerals as those in FIG. 9 designate the same components. Reference numeral 30 is a symbol detection circuit which detects a 0 and a 1 in input data D and outputs sampling pulses e and g. The input data D is supplied as an input modulating signal a to the voltage-controlled oscillator 1 via the adder 10, and the frequency-modulated signal b corresponding to the input data D is sent via the coupler 2 to the output terminal 16 for output. A portion of the frequency-modulated signal b is separated by the coupler 2 and input to the resonator 3.

Suppose here that the frequency-modulated signal b from the voltage-controlled oscillator 1 is at its negative maximum frequency deviation when the input data D is a 0, and at its positive maximum frequency deviation when it is a 1. Then, the output signal of the resonator 3 is detected by the detector 4, and the detected output signal c is sampled and held by the first sample-and-hold circuit 6 at a first timing where a 0 occurs, and sampled and held by the second sample-and-hold circuit 7 at a second timing where a 1 occurs. The difference between the sample-and-hold output signals d and f is obtained by the differential amplifier 8, and the difference as an error signal is returned via the loop filter 9 and adder 10 to the voltage-controlled oscillator 1 for negative feedback.

Figure 15:
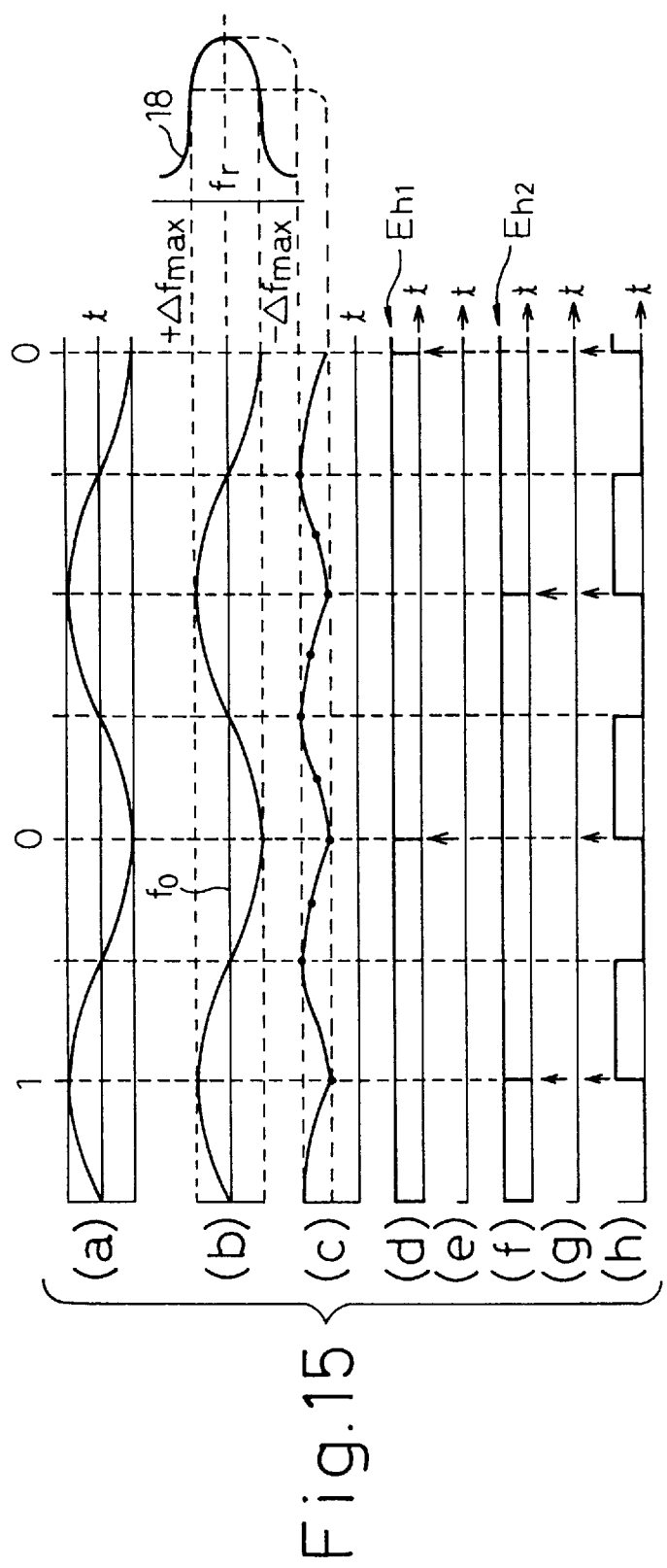
FIGS. 15 and 16 are waveform diagrams for explaining the operation of the apparatus of FIG. 14.

FIG. 15 is a diagram for explaining a center frequency coincidence state in the third embodiment of the present invention. The waveforms of the respective signals a to g in FIG. 14 are shown in (a) to (g), with time t plotted along the abscissa. Further, (h) shows a clock signal generated from the input data D. Reference numeral 18 shows the band-pass single-peak characteristic of the resonator 3, with $f_r$ designating its resonant frequency (center frequency) and $f_0$ the center frequency of the voltage-controlled oscillator 1.

In the example shown, the input modulating signal a practically representing the input data D has a waveform resembling a low-pass filtered sine wave, as shown in (a). The positive maximum frequency deviation $+\Delta f_{max}$ of the frequency-modulated signal b corresponds to a 1 in the input data D and the negative maximum frequency deviation $-\Delta f_{max}$ corresponds to a 0 in the input data D, as shown in (b).

When the center frequency $f_0$ of the voltage-controlled oscillator 1 is equal to the resonant frequency (center frequency) $f_r$ of the resonator 3, the output signal of the resonator 3 is maximum when the frequency-modulated signal b is at the center frequency $f_0$, and is minimum when the frequency-modulated signal b is at its positive/negative maximum frequency deviation $\pm \Delta f_{max}$. The detected output signal c is thus as shown in (c).

The sampling pulse e shown in (e) is applied to the first sample-and-hold circuit 6 at the time of input of data 0, and the sampling pulse g shown in (g) is applied to the second sample-and-hold circuit 7 at the time of input of data 1, each circuit thus sampling and holding the detected output signal c. The sample-and-hold output signal d ($E_{h1}$) from the first sample-and-hold circuit 6 is as shown in (d), and the sample-and-hold output signal f ($E_{h2}$) from the second sample-and-hold circuit 7 is as shown in (f). In this case, since $E_{h1}=E_{h2}$, the output signal $E_e$ of the differential amplifier 8 is zero. That is, in the state of $f_0=f_r$, the error signal is zero.

Figure 16:
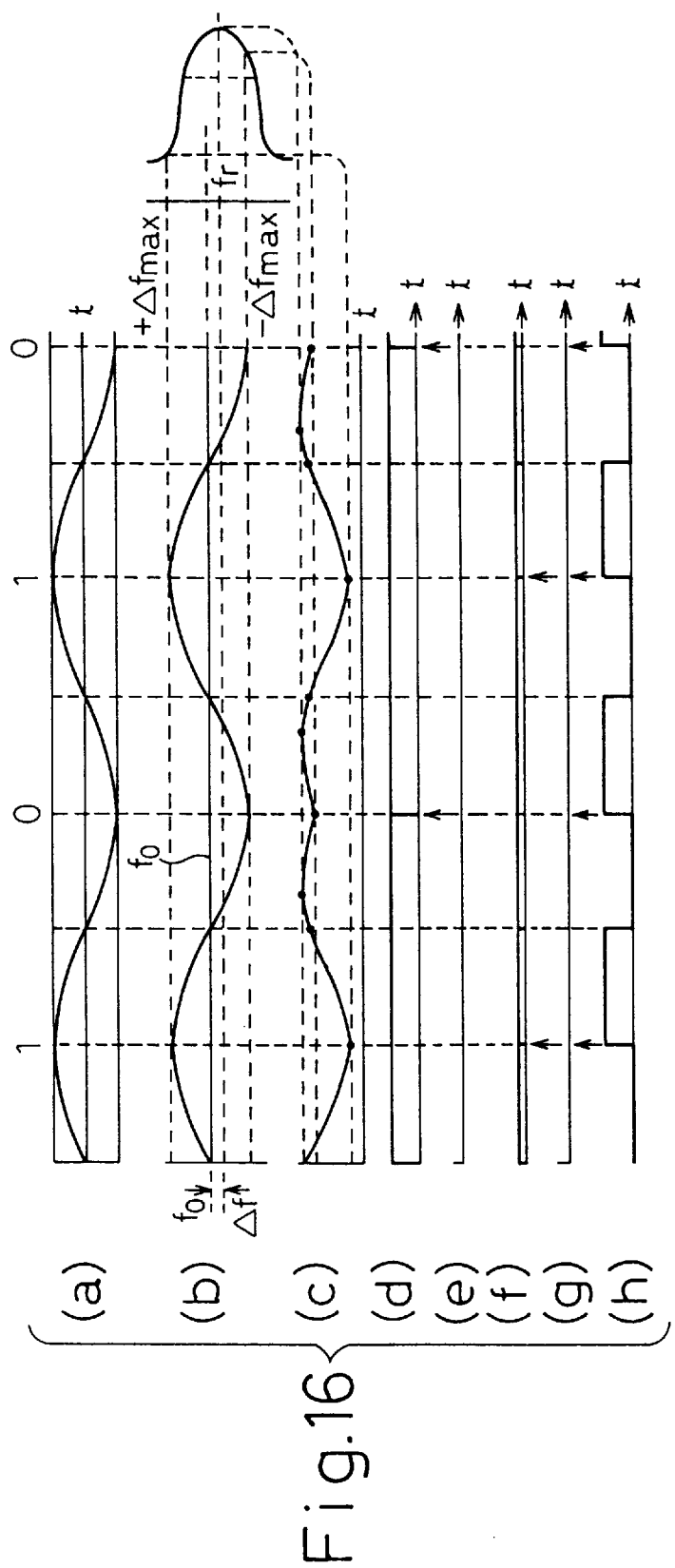

FIG. 16 is a diagram for explaining a center frequency noncoincidence state in the third embodiment of the present invention. The same reference numerals as those in FIG. 15 show the waveforms of the signals with the same names. When the center frequency $f_0$ of the voltage-controlled oscillator 1 is shifted in the positive direction by $\Delta f$ from the resonant frequency (center frequency) $f_r$ of the resonator 3, the positive maximum frequency deviation $+\Delta f_{max}$ corresponding to a 1 in the input data D is also shifted by $\Delta f$ in the positive direction, and in like manner, the negative maximum frequency deviation $-\Delta f_{max}$ corresponding to a 0 in the input data D is also shifted by $\Delta f$ in the positive direction.

As a result, the sample-and-hold output signals d ($E_{h1}$) and f ($E_{h2}$) are related by $E_{h1}>E_{h2}$, as shown in (d) and (f). When the center frequency $f_0$ of the voltage-controlled oscillator 1 is shifted in the negative direction by $\Delta f$ from the resonant frequency (center frequency) $f_r$ of the resonator 3, the relation is $E_{h1}<E_{h2}$.

The output signal $E_e$ of the differential amplifier 8 is then $E_e=E_{h1}-E_{h2}\neq 0$, and the difference as an error signal is returned via the loop filter 9 and adder 10 to the voltage-controlled oscillator 1 for negative feedback control to achieve $f_0=f_r$. That is, the center frequency $f_0$ of the voltage-controlled oscillator 1 is automatically controlled so that it coincides with the resonant frequency (center frequency) $f_r$ of the resonator 3.

Figure 17:
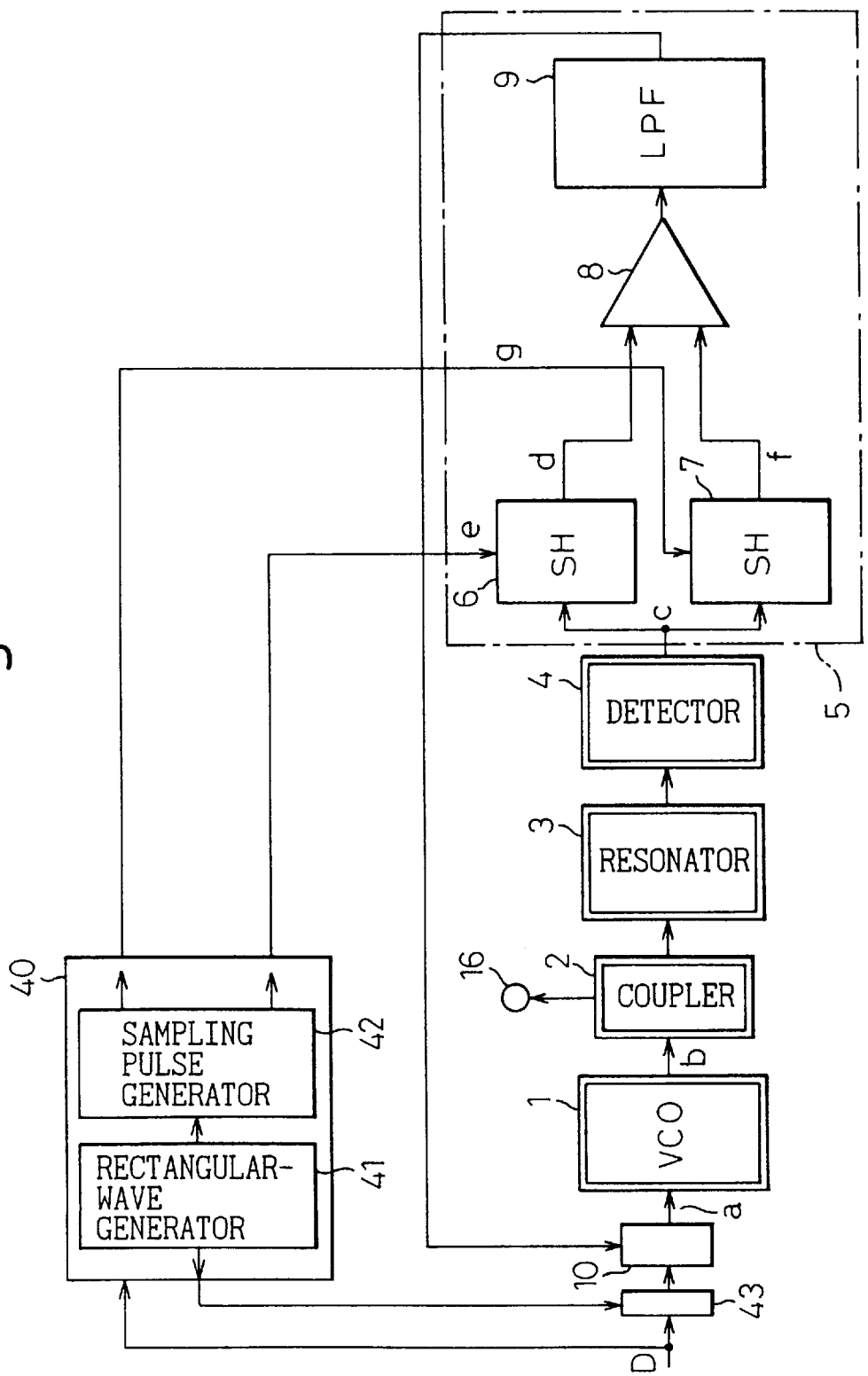
FIG. 17 is an automatic frequency control apparatus according to a fourth embodiment of the present invention.

FIG. 17 is a diagram showing a fourth embodiment of the present invention, in which the same reference numerals as those in FIG. 9 designate the same components. Reference numeral 40 is a timing controller, 41 is a rectangular-wave generator, 42 is a sampling pulse generator, 43 is an inserter, and D is input data. The input data D is supplied as an input modulating signal a to the voltage-controlled oscillator 1 via the inserter 43 and adder 10.

The input data D is an irregular pattern consisting of 0s and 1s, as previously described, and at a timing that does not cause an error in the input data D, a rectangular-wave signal is generated from the rectangular-wave generator 41 in the timing controller 40 and inserted in the inserter 43. For a timing that does not cause an error in the input data D, for example, the timing of a specified bit or a frame synchronization bit in the frame synchronization pattern of the input data D can be used. The sampling pulse generator 42 outputs sampling pulses e and g in synchronism with the rising and falling of the rectangular-wave signal.

A portion of the frequency-modulated signal b from the voltage-controlled oscillator 1 is separated by the coupler 2 and input to the resonator 3 whose output is detected by the detector 4. The detected output signal c is sampled and held by the first and second sample-and-hold circuits 6 and 7, and the sample-and-hold output signals d and f are input to the differential amplifier 8 to obtain the difference. The difference as an error signal is returned via the loop filter 9 and adder 10 to the voltage-controlled oscillator 1 for negative feedback.

In this configuration, since the frequency-modulated signal b from the voltage-controlled oscillator 1 shows positive and negative maximum frequency deviations in accordance with the rectangular-wave signal, the detected output signal at the time of the maximum frequency deviation at the rising of the rectangular-wave signal and the detected output signal at the time of the maximum frequency deviation at the falling of the rectangular-wave signal are sampled and held by the first and second sample-and-hold circuits 6 and 7, respectively. Then, the difference between the sample-and-hold output signals d and f from the first and second sample-and-hold circuits 6 and 7 is obtained by the difference amplifier 8, and the difference is taken as the error signal.

Figure 18:
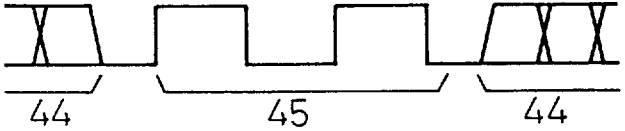
FIG. 18 is a waveform diagram for explaining the operation of the apparatus of FIG. 17.

FIG. 18 is a diagram for explaining the operation of the fourth embodiment of the present invention. (A) shows the input modulating signal a consisting of the input data 44 and rectangular-wave signal 45, with the rectangular-wave signal 45 inserted in the input data 44 with predetermined cycles, as previously described; in the example shown, two cycles of the rectangular-wave signal 45 are inserted, but one cycle or three or more cycles can be inserted.

The cycle with which the rectangular-wave signal 45 is inserted can be selected according to the long-term stability, etc. required of the voltage-controlled oscillator 1, and can be set to such a degree that the influence on the data to be transmitted by frequency modulation can be ignored. In the case of inserting the rectangular-wave signal 45 in the frame synchronization pattern as previously described, if it is inserted at intervals of a predetermined number of cycles larger than the number of synchronization protection stages, the center frequency of the voltage-controlled oscillator 1 can be stabilized without affecting the detection of an out-of-synchronization condition.

Further, (B) and (C) show examples of the sampling pulses e and g, respectively, while (D) and (E) show examples of the sample-and-hold output signals d and f, respectively. As in the foregoing embodiments, when the center frequency $f_0$ of the voltage-controlled oscillator 1 is identical with the resonant frequency (center frequency) $f_r$ of the resonator 3, the sample-and-hold output signals d and f of the first and second sample-and-hold circuits 6 and 7 are identical with each other; since an error signal proportional to the direction and amount of deviation of the center frequency $f_0$ of the voltage-controlled oscillator 1 can be obtained by means of the differential amplifier 8, the center frequency $f_0$ of the voltage-controlled oscillator 1 can be controlled constantly and automatically so that it coincides with the resonant frequency (center frequency) $f_r$ of the resonator 3.

Figure 19:
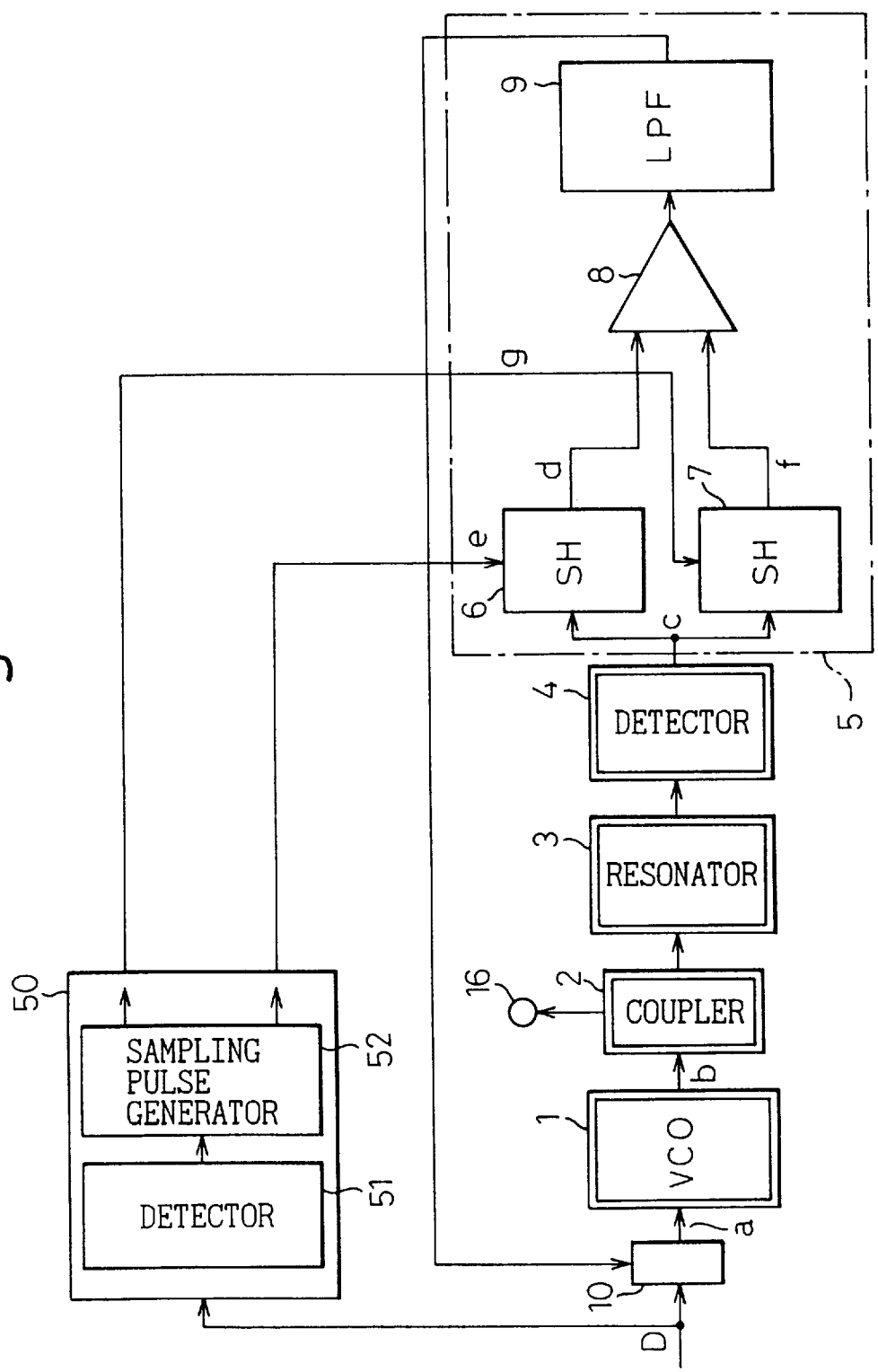
FIG. 19 is an automatic frequency control apparatus according to a fifth embodiment of the present invention.

FIG. 19 is a diagram showing a fifth embodiment of the present invention, in which the same reference numerals as those in FIG. 9 designate the same components. Reference numeral 50 is a timing controller, 51 is a detector, and 52 is a sampling pulse generator. In this embodiment, the input data D is burst data, and a preamble period at the head of it, consisting of a pattern of alternate sequences of 0s and 1s for bit timing regeneration, is utilized.

That is, the preamble period is detected by the detector 51 in the timing controller 50 and, by detecting 0s an 1s in the preamble period, the sampling pulse generator 52 is controlled to generate the sampling pulses e and g. In accordance with the thus generated sampling pulses e and g, the detected output signal c from the detector 4 is sampled and held by the first and second sample-and-hold circuits 6 and 7, and the sample-and-hold output signals d and f are input to the differential amplifier 8. Then, their difference, as an error signal, is returned via the loop filter 9 and adder 10 to the voltage-controlled oscillator 1 for negative feedback.

In this case, in the preamble period during which alternate sequences of 0s and 1s appear, the frequency-modulated signal b swings alternately between the positive and negative maximum frequency deviations, and the detected output signal at the respective times is sampled and held. When there occurs a difference between the sample-and-hold output signals d and f, this means that the center frequency $f_0$ of the voltage-controlled oscillator 1 is deviated from the resonant frequency (center frequency) $f_r$ of the resonator 3; therefore, as described above, the error signal is returned for negative feedback, to control the center frequency $f_0$ of the voltage-controlled oscillator 1. In this way, the center frequency of the voltage-controlled oscillator 1 can be constantly and automatically controlled to the predetermined $f_0$.

In each of the above embodiments, the resonator 3 has been described as having a band-pass single-peak characteristic, but instead, the resonator 3 may be configured to have a band-elimination single-peak characteristic. As for the sampling timings at the time of the positive and negative maximum frequency deviations in accordance with the rectangular-wave signal, the sampling pulses e and g may be generated with timings slightly delayed from the detection timings of the rising and falling edges of the rectangular-wave signal; in this way, the timing where the frequency settles down at the maximum frequency deviation can be selected as the sampling timing. Further, the signal inserted in data, etc. is not limited to the rectangular waveform, but it is also possible to use a signal of other waveform such as a triangular waveform or sawtooth waveform that causes the positive and negative maximum frequency deviations. As described above, the present invention is not limited to the illustrated embodiments, but various additions and modifications may be made in the invention.

As described above, the present invention concerns an automatic frequency control apparatus for stabilizing the center frequency of the voltage-controlled oscillator 1 that outputs a frequency-modulated signal in accordance with an input modulating signal, and has the advantage of reducing the number of components compared with the prior art by reducing the number of ultra-high frequency circuit components, i.e., the resonator 3 and the detector 4, to one each. This in turn offers the advantage of reducing the size and cost of the apparatus.

Furthermore, the number of parameters that need adjusting is reduced to only one, that is, adjusting the resonant frequency (center frequency) $f_r$ of the resonator 3 to the desired center frequency $f_0$, and because of its single-peak characteristic, the advantage is that the adjustment is simple compared with the prior art. Moreover, since the first and second sample-and-hold circuits 6 and 7, the differential amplifier 8, and the loop filter 9, which together constitute the control circuit 5, are low-frequency circuits, these can be easily implemented in a semiconductor integrated circuit, and the construction can be made compact and inexpensive.

I claim:

1. An automatic frequency control apparatus for stabilizing the oscillation frequency of a voltage-controlled oscillator, comprising:

a timing signal generating circuit for generating a first timing signal to indicate that a control voltage input to said voltage-controlled oscillator is at a first value, and a second timing signal to indicate that said control voltage input is at a second value;

a resonator which has a single-peak characteristic, and to which a portion of an output of said voltage-controlled oscillator is input;

a detector for detecting an output of said resonator;

a first sample-and-hold circuit for sampling and holding an output of said detector in accordance with said first timing signal;

a second sample-and-hold circuit for sampling and holding an output of said detector in accordance with said second timing signal;

an operational amplifier for accepting outputs of said first and second sample-and-hold circuits, and for outputting a feedback voltage based on said outputs; and an adder for adding said feedback voltage to said control voltage input to said voltage-controlled oscillator.

2. An apparatus according to claim 1, wherein said control voltage input is a periodic signal generated based on a clock signal, and said timing signal generating circuit generates said first and second timing signals from said clock signal.

3. An apparatus according to claim 1, wherein said control voltage input is a periodic signal with a rectangular-wave signal inserted therein, and said timing signal generating circuit generates said first and second timing signals from said rectangular-wave signal.

4. An apparatus according to claim 1, wherein said control voltage input is a binary signal, and said timing signal generating circuit generates said first and second timing signals by detecting each value of said binary signal.

5. An apparatus according to claim 1, wherein said control voltage input is a binary signal with a rectangular-wave signal inserted therein, and said timing signal generating circuit generates said first and second timing signals from said rectangular-wave signal.

6. An apparatus according to claim 1, wherein said control voltage input is a binary signal having a period during which the value thereof changes alternately, and said timing signal generating circuit generates said first and second timing signals by detecting each value during said period.

* * * * *